(12) United States Patent
Li et al.

(10) Patent No.: US 12,422,483 B2
(45) Date of Patent: Sep. 23, 2025

(54) GENERATOR SET CIRCUIT BREAKER APPARATUS SYNCHRONIZATION TEST METHOD AND APPARATUS, DEVICE, AND MEDIUM

(71) Applicant: CSG POWER GENERATION CO., LTD. MAINTENANCE AND TEST COMPANY, Guangdong (CN)

(72) Inventors: Qing Li, Guangzhou (CN); Peng Ling, Guangzhou (CN); Yu Gong, Guangzhou (CN); Yakang Zhao, Guangzhou (CN); Xiangdong Liu, Guangzhou (CN); Yalin Jia, Guangzhou (CN); Liangliang Nie, Guangzhou (CN); Mingxuan Yang, Guangzhou (CN); Jialiang Yu, Guangzhou (CN); Zhao Wu, Guangzhou (CN); Minghao Huang, Guangzhou (CN); Jun Jiang, Guangzhou (CN); Wenhan Huang, Guangzhou (CN); Chang Xiao, Guangzhou (CN); Haixia Yang, Guangzhou (CN); Dongyang Hu, Guangzhou (CN); Yaxiong Yu, Guangzhou (CN); Pengchao Qi, Guangzhou (CN); Xuan Xie, Guangzhou (CN)

(73) Assignee: CSG Power Generation Co., LTD. Maintenance and Test Company, Guangdong (CN)

( * ) Notice: Subject to any disclaimer, the term of this patent is extended or adjusted under 35 U.S.C. 154(b) by 0 days.

(21) Appl. No.: 18/996,190

(22) PCT Filed: May 30, 2023

(86) PCT No.: PCT/CN2023/097033
§ 371 (c)(1),
(2) Date: Jan. 17, 2025

(87) PCT Pub. No.: WO2024/113731
PCT Pub. Date: Jun. 6, 2024

(65) Prior Publication Data
US 2025/0258229 A1    Aug. 14, 2025

(30) Foreign Application Priority Data
Nov. 30, 2022   (CN) .......................... 202211513354.7

(51) Int. Cl.
*G01R 29/18* (2006.01)
*G01R 31/327* (2006.01)

(52) U.S. Cl.
CPC ......... *G01R 31/3272* (2013.01); *G01R 29/18* (2013.01)

(58) Field of Classification Search
None
See application file for complete search history.

(56) References Cited

U.S. PATENT DOCUMENTS

2009/0055031 A1    2/2009   Slota et al.

FOREIGN PATENT DOCUMENTS

| CN | 102854467 A | 1/2013 |
|---|---|---|
| CN | 102856929 A | 1/2013 |

(Continued)

OTHER PUBLICATIONS

English translation of CN 111541276 A (Year: 2020).*

(Continued)

*Primary Examiner* — Jermele M Hollington
(74) *Attorney, Agent, or Firm* — Sandberg Phoenix & von Gontard, PC

(57) ABSTRACT

A method of synchronization test of a generator set outlet switch apparatus includes that: prior to a synchronization (Continued)

grid-connected closing of an outlet switch apparatus of a target generator set, a wiring phase sequence of a synchronization apparatus is determined to be correct; then three-phase closings of the outlet switch apparatus are determined to be synchronous; two-side voltage waveform data at a closing moment of the outlet switch apparatus is measured and recorded; and a simulated synchronization closing quality coefficient of the outlet switch apparatus of the target generator set is determined according to the two-side voltage waveform data, and a synchronization closing performance of the outlet switch apparatus of the target generator set is evaluated according to the simulated synchronization closing quality coefficient.

9 Claims, 3 Drawing Sheets

(56) References Cited

FOREIGN PATENT DOCUMENTS

| CN | 105182156 | A | | 12/2015 | | |
|---|---|---|---|---|---|---|
| CN | 105319466 | A | | 2/2016 | | |
| CN | 105334453 | A | | 2/2016 | | |
| CN | 106208150 | A | | 12/2016 | | |
| CN | 107505569 | A | | 12/2017 | | |
| CN | 206960619 | U | | 2/2018 | | |
| CN | 109599902 | A | | 4/2019 | | |
| CN | 111541276 | A | * | 8/2020 | ............ | G01R 29/18 |
| CN | 112345938 | A | | 2/2021 | | |
| CN | 113189411 | A | | 7/2021 | | |
| CN | 113572205 | A | | 10/2021 | | |
| CN | 216285615 | U | * | 4/2022 | | |
| CN | 115051328 | A | | 9/2022 | | |
| CN | 115542146 | A | | 12/2022 | | |
| WO | 2022227401 | A1 | | 11/2022 | | |

OTHER PUBLICATIONS

English translation of CN 216285615 U (Year: 2022).*
International Search Report and Written Opinion for corresponding PCT/CN2023/097033 mailed on Jul. 24, 2023.
Tseng, T.-H., Huang, P.-H., & Chang, Y.-H. (2011). Analysis of Effects of Synchronism Conditions on Power System Operation. In Proceedings of the SICE Annual Conference 2011, Waseda University, Tokyo, Japan, Sep. 13-18, 2011.
Peng, J., Song, L., Niu, L., & Yuan, P. (2013). Calculation and Analysis of Phase-angle Difference at the Moment of Generator Parallel Switching [in Chinese]. Electric Power Science and Engineering, 29(4), 40. Shaanxi Institute of Heat Research Co., Ltd. & Shaanxi University of Science and Technology, Xi'an, China.
Zhong, H., Zhang, N., & Pan, D. (2011). Design of Asynchronous Breaker Closing Equipment of Warship Power System. Ship Electric Technology [船电技术], 31(11), 13-03. DOI: 1003-4862(2011)11-0013-03.
Notification to Grant Patent Right for Invention mailed Jan. 10, 2023 for priority Chinese Application No. 202211513354.7.

* cited by examiner

GENERATOR SET CIRCUIT BREAKER APPARATUS SYNCHRONIZATION TEST METHOD AND APPARATUS, DEVICE, AND MEDIUM

CROSS-REFERENCE TO RELATED APPLICATION(S)

This is a national stage application filed under 37 U.S.C. 371 based on International Patent Application No. PCT/CN2023/097033, filed May 30, 2023, which claims priority to Chinese Patent Application No. 202211513354.7, filed with the China National Intellectual Property Administration (CNIPA) on Nov. 30, 2022, the disclosures of which are incorporated herein by reference in their entireties.

TECHNICAL FIELD

An embodiment of the present application relates to the field of generator set startup and commissioning technologies, for example, a method and apparatus for synchronization test of a generator set outlet switch apparatus, a device, and a medium.

BACKGROUND

With the aim of "carbon peaking and carbon neutralization", the hydroelectric power generation industry comes up with the opportunity of booming development, and the number of newly-built hydroelectric power stations, in particular, pumped storage power stations, is increasing. The whole group startup test is the last procedure for inspecting the newly-built hydroelectric generator set to be put into commercial operation, which verifies the manufacturing and the mounting quality of the generator set, and also determines the reliability and stability of the operation of the generator set. A generator set outlet switch apparatus is a hub connecting a generator and a power system, and is responsible for the functions of connecting and disconnecting normal load current and switching the fault current, and the synchronization closing performance thereof determines the reliability of the operation of the generator. The synchronization grid-connection of the generator set outlet switch apparatus is an important milestone node of the whole group startup test of the generator set, and is the key for the newly-built generator set to switch from a no-load dynamic balancing test to a load test. However, due to reasons such as, poor device manufacturing, poor mounting quality, and inappropriate parameter setting, a lot of problems exist in the synchronization grid-connection of the current newly-built generator set outlet switch apparatus.

SUMMARY

Embodiments of the present application provide a method and apparatus for synchronization test of a generator set outlet switch apparatus, a device, and a medium, to verify the synchronization closing performance prior to the synchronization grid-connection of the generator set outlet switch apparatus, thereby effectively avoiding the problem of burn-out of a generator and an outlet switch apparatus caused by a non-synchronization closing.

According to an aspect of the embodiments of the present application, a method for synchronization test of a generator set outlet switch apparatus is provided. The method includes that prior to a synchronization grid-connected closing of an outlet switch apparatus of a target generator set, whether a wiring phase sequence of a synchronization apparatus is correct is determined; in a case where the wiring phase sequence of the synchronization apparatus is determined to be correct, whether three-phase closings of the outlet switch apparatus are synchronous is determined; in a case where the three-phase closings of the outlet switch apparatus are determined to be satisfied the synchronism, two-side voltage waveform data at a closing moment of the outlet switch apparatus is measured and recorded; and a simulated synchronization closing quality coefficient of the outlet switch apparatus of the target generator set is determined according to the two-side voltage waveform data, and a synchronization closing performance of the outlet switch apparatus of the target generator set is evaluated according to the simulated synchronization closing quality coefficient.

According to another aspect of the embodiments of the present application, an apparatus for synchronization test of a generator set outlet switch apparatus is provided. The apparatus includes that a first determination module, a second determination module, a measurement and recording module and an evaluation module. The first determination module is configured to determine whether a wiring phase sequence of a synchronization apparatus is correct prior to a synchronization grid-connected closing of an outlet switch apparatus of a target generator set. The second determination module is configured to determine whether three-phase closings of the outlet switch apparatus are synchronous in a case where the wiring phase sequence of the synchronization apparatus is determined to be correct. The measurement and recording module is configured to measure and record two-side voltage waveform data at a closing moment of the outlet switch apparatus in a case where the three-phase closings of the outlet switch apparatus are determined to be satisfied the synchronism. The evaluation module is configured to determine a simulated synchronization closing quality coefficient of the outlet switch apparatus of the target generator set according to the two-side voltage waveform data, and evaluate a synchronization closing performance of the outlet switch apparatus of the target generator set according to the simulated synchronization closing quality coefficient.

According to another aspect of the embodiments of the present application, an electronic device is provided. The electronic device includes at least one processor and a memory communicatively connected to the at least one processor. The memory stores a computer program executable by the at least one processor, and the computer program, when executed by the at least one processor, causes the at least one processor to perform the method for the synchronization test of the generator set outlet switch apparatus of any one of the embodiments of the present application.

According to another aspect of the embodiments of the present application, a computer-readable storage medium is provided. The computer-readable storage medium stores a computer instruction. The computer instruction is configured to implement, when executed by a processor, the method for the synchronization test of the generator set outlet switch apparatus of any one of the embodiments of the present application.

BRIEF DESCRIPTION OF DRAWINGS

The drawings used for describing the embodiments will be briefly introduced below. The drawings in the following description are merely some embodiments of the present

DETAILED DESCRIPTION

In order that those skilled in the art may better understand solutions of embodiments of the present application, the technical solutions in the embodiments of the present application will be described clearly and completely below in conjunction with drawings in the embodiments of the present application. Apparently, the described embodiments are merely part of the embodiments of the present application, rather than all of the embodiments of the present application. All other embodiments obtained by those of ordinary skill in the art based on the embodiments of the present application without requiring creative efforts shall all fall within the scope of protection of the embodiments of the present application.

It is to be noted that the terms "first", "second" and the like in the description and claims of the embodiments of the present application, and in the foregoing drawings, are used for distinguishing between similar objects and not necessarily for describing a particular order or sequential order. It should be understood that the data so used are interchangeable as appropriate so that embodiments of the present application described herein can be implemented in an order other than those illustrated or described herein. Moreover, the terms "include" and "have" as well as any variations thereof, are intended to cover a non-exclusive inclusion, for example, a process, a method, a system, a product, or a device that includes a series of steps or units may include other steps or units not expressly listed or inherent to such process, method, product, or device.

Figure 1:
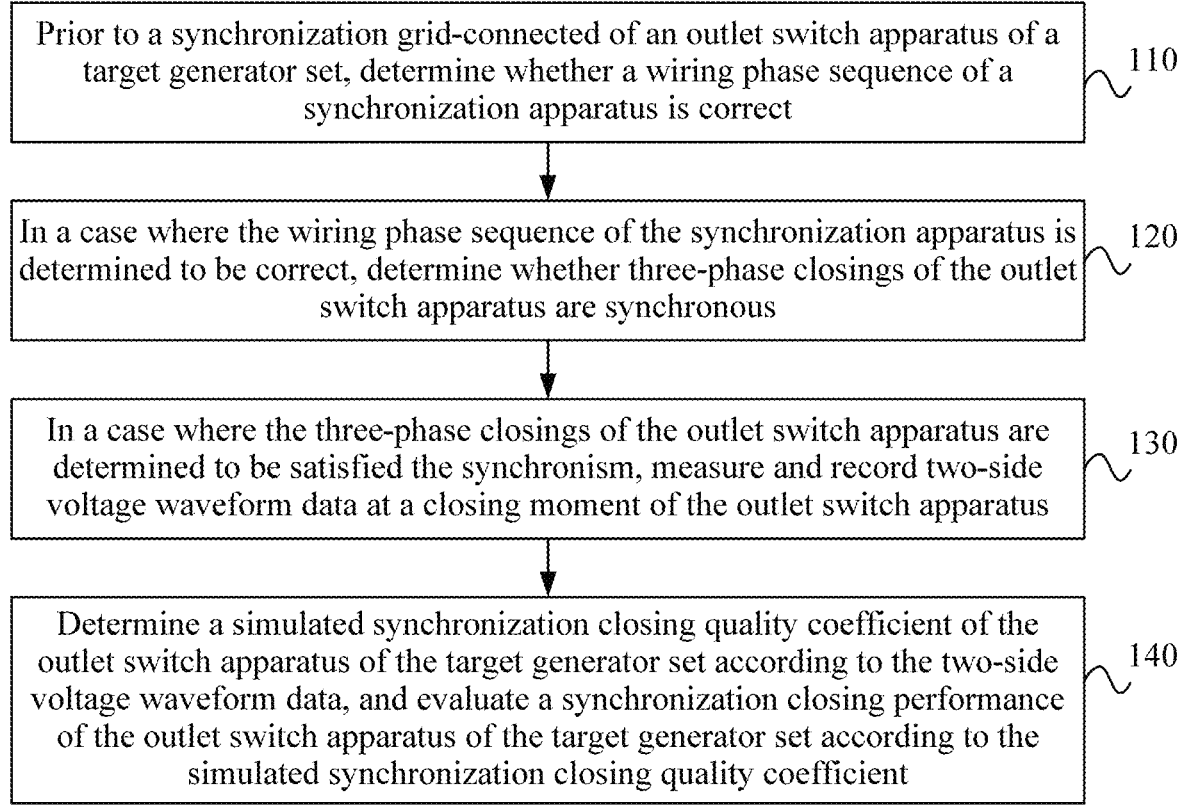
FIG. 1 is a flowchart of a method for synchronization test of a generator set outlet switch apparatus according to an embodiment of the present application.

FIG. 1 is a flowchart of a method for synchronization test of a generator set outlet switch apparatus according to an embodiment of the present application. This embodiment is applicable to a condition that the synchronization closing performance is verified prior to the synchronization grid-connection of the generator set outlet switch apparatus. The method may be executed by an apparatus for synchronization test of a generator set outlet switch apparatus, and the apparatus for the synchronization test of the generator set outlet switch apparatus may be achieved in a form of hardware and/or software and may be configured in an electronic device such as a computer, a server or a tablet computer. Referring to FIG. 1, the method includes the following steps.

In step 110, prior to a synchronization grid-connected of an outlet switch apparatus of a target generator set, whether a wiring phase sequence of a synchronization apparatus is correct is determined.

The target generator set may be a pumped storage generator set or a diesel generator set and the like, and the target generator set may include multiple generators, such as, three or four generators.

In this embodiment, the outlet switch apparatus is a circuit breaker device connecting the generator and the power grid system and is a junction for electric energy transmission and plays the roles of connecting and disconnecting normal load current and cutting off fault current. The synchronization apparatus is an indication, monitoring and control apparatus used when a grid connection is executed in an operation process of a power system, and the synchronization apparatus may detect whether a grid frequency, a voltage amplitude and a voltage phase on two sides of a grid connection point reach a condition to assist the manual grid connection or achieve the automatic grid connection. In the operation process of the power system, it is often necessary to parallel a tie line of the system or a tie transformer with the power system, and this operation of incorporating a small system into a large system through a switch device such as the outlet switch apparatus is referred to as a synchronous operation.

Optionally, in this embodiment, prior to the synchronization grid-connected of the outlet switch apparatus of the target generator set, determining whether a wiring phase sequence of a synchronization apparatus is correct may include that: at least three-phase different target voltages are applied at a secondary terminal of a generator outlet voltage transformer through an alternating current power generator, and at least three-phase different reference voltages are applied at a secondary terminal of a main transformer low-voltage side voltage transformer through the alternating current power generator; and when an A-phase voltage in the target voltages and an A-phase voltage in the reference voltages satisfy a preset relationship, the wiring phase sequence of the synchronization apparatus is determined to be correct.

Figure 2:
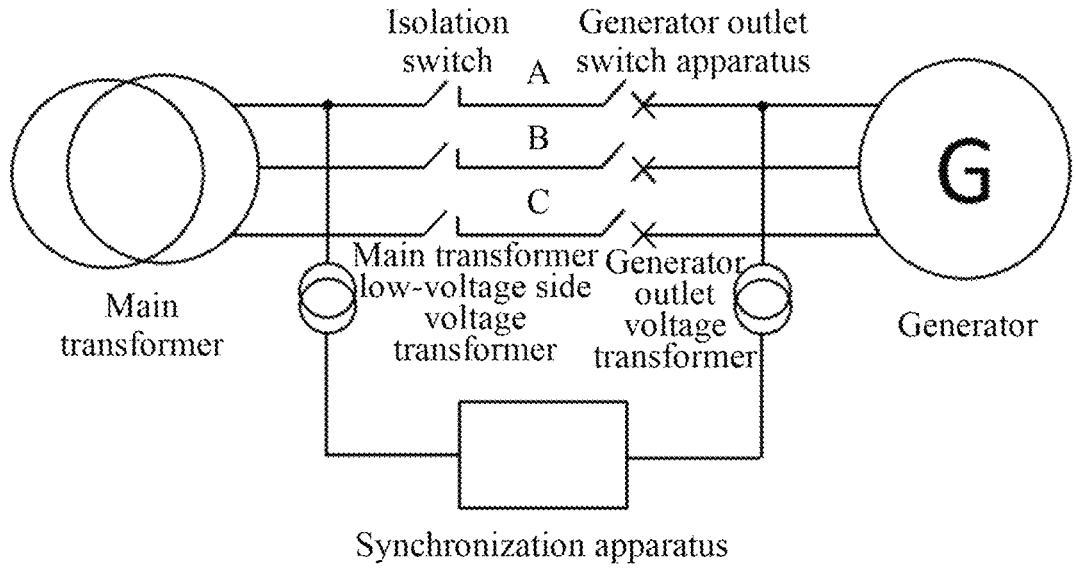
FIG. 2 is a typical wiring diagram of a synchronization apparatus according to an embodiment of the present application.

The preset relationship may be whether an absolute value of a difference value between the A-phase voltage in the target voltages and the A-phase voltage in the reference voltages is less than a set value, where the set voltage may be 0.5V or 0.6V and the like. In a specific implementation, the correctness of the wiring phase sequence of the synchronization apparatus may be inspected by using the alternating current power generator and referring to a typical wiring diagram of the synchronization apparatus (as shown in FIG. 2). Optionally, a sampling voltage terminal of the synchronization apparatus may connect a single-phase secondary voltage of a voltage transformer on two sides of a generator outlet switch apparatus, that is, a voltage $U_{1a}$ on one side is sampled from an A-phase secondary voltage terminal of the generator outlet voltage transformer, and a voltage $U_{2a}$ on the other side is sampled from an A-phase secondary voltage terminal of a main transformer low-voltage side. In this embodiment, three-phase different voltages, i.e., three-phase different target voltages $U_n$ (n=a, b, c) are sequentially applied at a secondary terminal of a generator outlet voltage transformer by using a low-voltage alternating current power generator, three-phase different voltages. i.e., three-phase different reference voltages $U_m$ (m=A, A, C) are sequentially applied at a secondary terminal of a main transformer low-voltage side voltage transformer by using the low-voltage alternating current power generator, and further the A-phase voltage $U'_a$ and $U'_A$ displayed by the synchronization apparatus may be checked, where $U'_a$ is the A-phase voltage in the target voltages, and $U'_A$ is the A-phase voltage in the reference voltages.

In an embodiment, it may be determined that whether $(|U'_a-U_a|<0.5V)$ & $(|U'_A-U_A|<0.5V)$ is true or false, and if it is true, then the wiring phase sequence of the synchronization apparatus may be determined to be correct.

In another optional implementation of this embodiment, after determining whether the wiring phase sequence of the synchronization apparatus is correct, the method further includes that: in a case where the wiring phase sequence of the synchronization apparatus is determined to be incorrect, a voltage sampling wiring circuit of the synchronization apparatus is investigated, and the at least three-phase different target voltages are continued to be applied at the secondary terminal of the generator outlet voltage transformer through the alternating current power generator, and the at least three-phase different reference voltages are continued to be applied at the secondary terminal of the main transformer low-voltage side voltage transformer through the alternating current power generator, until the A-phase voltage in the target voltages and the A-phase voltage in the reference voltages are determined to satisfy the preset relationship.

Optionally, in this embodiment, if it is determined that $(|U'_a-U_a|<0.5V)$ & $(|U'_A-U_A|<0.5V)$ is false, then it may be determined that the wiring phase sequence of the synchronization apparatus is incorrect. Optionally, the voltage sampling wiring circuit of the synchronization apparatus may be investigated, after a wiring error reason is eliminated, the low-voltage alternating current power generator is used again to apply voltage until it is verified that $(|U'_a-U_a|<0.5V)$ & $(|U'_A-U_A|<0.5V)$ is true.

It is to be noted that, in this embodiment, whether the wiring phase sequence of the synchronization apparatus is correct may also be verified in other manners. Exemplarily, the correctness of the wiring phase sequence of the synchronization apparatus may be determined by determining whether a B-phase voltage in the target voltages and a B-phase voltage in the reference voltages satisfy a preset relationship, and the correctness of the wiring phase sequence of the synchronization apparatus may also be determined by determining whether a C-phase voltage in the target voltages and a C-phase voltage in the reference voltages satisfy a preset relationship.

In step 120, in a case where the wiring phase sequence of the synchronization apparatus is determined to be correct, whether three-phase closings of the outlet switch apparatus are synchronous is determined.

In an optional implementation of this embodiment, after the correctness of the wiring phase sequence of the synchronization apparatus is determined, if it is determined that the wiring phase sequence of the synchronization apparatus is correct, that is, in a case where the wiring phase sequence of the synchronization apparatus is determined to be correct, the synchronism of the three-phase closings of the outlet switch apparatus may further be determined.

Optionally, in this embodiment, whether the three-phase closings of the outlet switch apparatus are synchronous is determined may include that: a synchronization closing instruction is sent to the outlet switch apparatus through the synchronization device, time of three-phase of the outlet switch apparatus at a closing position is queried, and three-phase synchronization time is calculated out according to the time; and when the three-phase synchronization time is less than a set time threshold value, the three-phase closings of the outlet switch apparatus are determined to satisfy the synchronism.

The set time threshold may be 4 ms, 5 ms, 6 ms and the like.

In a specific implementation, a synchronization closing instruction is sent to the outlet switch apparatus through the synchronization apparatus, time, i.e., $t_A$, $t_B$, $t_C$ of three-phase of the generator outlet switch apparatus at the closing position is queried on a computer monitoring system, and further three-phase synchronization time $t_h$ is calculated out by using the following formula:

$$t_h = \text{Max}\{|t_A-t_B|, |t_A-t_C|, |t_B-t_C|\};$$

In an embodiment, it may be determined whether the three-phase synchronization time $t_h$ is less than the set time threshold value, when the three-phase synchronization time is less than the set time threshold value, the three-phase closings of the outlet switch apparatus are determined to satisfy the synchronism. Exemplarily, it may be determined whether $t_h<5$ ms is true or false, if it is true, then the three-phase closings of the outlet switch apparatus are determined to satisfy the synchronism: if it is false, then an operation mechanism of the generator outlet switch apparatus is investigated, after a problem of asynchronous action of the operation mechanism is eliminated, the synchronization apparatus is controlled again to send a synchronization closing instruction, until it is verified that $t_h<5$ ms is true.

It is to be noted that, in this embodiment, the synchronization apparatus may automatically send the synchronization closing instruction to the outlet switch apparatus, and may also enable the synchronization apparatus to send the synchronization closing instruction to the outlet switch apparatus by means of a manual operation of a user.

In step 130, in a case where the three-phase closings of the outlet switch apparatus are determined to be satisfied the synchronism, two-side voltage waveform data at a closing moment of the outlet switch apparatus is measured and recorded.

The two-side voltage waveform data at the closing moment of the outlet switch apparatus may include at least one generator outlet side voltage and at least one main transformer low-voltage side voltage.

In an optional implementation of this embodiment, in a case where the three-phase closings of the outlet switch apparatus are determined to satisfy the synchronism, when isolation switches between a main transformer and an outlet switch are opened, after the generator set is started to rotate, the synchronization apparatus is simulated to automatically correct the synchronization and then the closing instruction is sent to the outlet switch apparatus, so that the two-side voltage waveform data at the closing moment of the outlet switch apparatus may be measured and recorded. Optionally, in this embodiment, the isolation switches between the main transformer and the outlet switch may be simulated to be in the closing position (an actual knife gate position is in an open state), so that the generator set is started in a power generation direction, the synchronization apparatus automatically sends the synchronization closing instruction, and two-side voltages at the closing moment of the outlet switch apparatus are measured and recorded.

Optionally, in this embodiment, that the two-side voltage waveform data at the closing moment of the outlet switch apparatus is measured and recorded includes: generator outlet side voltages and main transformer low-voltage side voltages are measured and recorded at the closing moment of the outlet switch apparatus. Exemplarily, in this embodiment, the isolation switches between the main transformer and the outlet switch apparatus may be sequentially locked at the opening position; the isolating switches are short-circuited and connected to a position auxiliary node of the computer monitoring system, and the isolation switches are simulated to be in the closing position, and a control mode is set to "automatic" at the computer monitoring system. In an embodiment, the computer monitoring system may issue a power generation direction starting instruction; the generator set starts to a rated rotation speed in the power generation direction, and the synchronization apparatus automatically sends the synchronization closing instruction; waveforms at the closing moment of the generator outlet switch apparatus are measured and recorded, and the waveforms obtained by means of measuring and recording may be used to sequentially obtain generator output side voltages $U_a$, $U_b$, $U_c$ and main transformer low-voltage side voltages $U_A$, $U_B$, $U_C$.

In step 140, a simulated synchronization closing quality coefficient of the outlet switch apparatus of the target generator set is determined according to the two-side voltage waveform data, and a synchronization closing performance of the outlet switch apparatus of the target generator set is evaluated according to the simulated synchronization closing quality coefficient.

In an optional implementation of this embodiment, after the two-side voltage waveform data (at least one generator outlet side voltage and at least one main transformer low-voltage side voltage) generated at the closing moment of the outlet switch apparatus is obtained by means of measuring and recording, the simulated synchronization closing quality coefficient of the outlet switch apparatus of the target generator set may be determined according to the two-side voltage waveform data obtained by means of measuring and recording, and the synchronization closing performance of the outlet switch apparatus of the target generator set is evaluated according to the simulated synchronization closing quality coefficient.

Optionally, in this embodiment, that the simulated synchronization closing quality coefficient of the outlet switch apparatus of the target generator set is determined according to the two-side voltage waveform data may include: amplitudes, frequencies and phase angles of the generator outlet side voltages and amplitudes, frequencies and phase angles of the main transformer low-voltage side voltages are respectively determined according to the generator outlet side voltages and the main transformer low-voltage side voltages, and a voltage amplitude difference, a frequency difference and a phase angle difference are determined; a voltage difference evaluation coefficient is determined according to the voltage amplitude difference; a frequency difference evaluation coefficient is determined according to the frequency difference; a phase angle difference evaluation coefficient is determined according to the phase angle difference; and the simulated synchronization closing quality coefficient is determined according to the voltage difference evaluation coefficient, the frequency difference evaluation coefficient, and the phase angle difference evaluation coefficient.

In a specific implementation, after waveform data of the generator output side voltages $U_a$, $U_b$, $U_c$ and waveform data of the main transformer low-voltage side voltages $U_A$, $U_B$, $U_C$ are obtained by means of measuring and recording, the amplitude values ($U_a$, $U_b$, $U_c$), the frequencies ($f_a$, $f_b$, $f_c$) and the phase angles ($\varphi_a$, $\varphi_b$, $\varphi_c$) of the generator outlet side voltages, as well as the amplitude values ($U_A$, $U_B$, $U_C$), the frequencies ($f_A$, $f_B$, $f_C$) and the phase angles ($\varphi_A$, $\varphi_B$, $\varphi_C$) of the main transformer low-voltage side voltages may be extracted at the closing moment of the outlet switch apparatus, and the voltage amplitude difference $\Delta U$, the frequency difference $\Delta f$ and the phase angle difference $\Delta \varphi$ are sequentially calculated according to the following formulas:

$$\Delta U = \left\{ \left| \frac{U_a - U_A}{U_A} \right|, \left| \frac{U_b - U_B}{U_B} \right|, \left| \frac{U_c - U_C}{U_C} \right| \right\};$$

$$\Delta f = \{|f_a - f_A|, |f_b - f_B|, |f_c - f_C|\};$$

$$\Delta \varphi = \{|\varphi_a - \varphi_A|, |\varphi_b - \varphi_B|, |\varphi_c - \varphi_C|\}.$$

In an embodiment, the voltage difference evaluation coefficient $\eta_U$ is obtained according to data of the voltage amplitude difference $\Delta U$:

$$\eta_U = \begin{cases} 1, & \Delta U < 5\%, \\ 0, & \Delta U \geq 5\% \end{cases}.$$

In an embodiment, the frequency difference evaluation coefficient $\eta_f$ is obtained according to data of the frequency difference $\Delta f$:

$$\eta_f = \begin{cases} 1, & \Delta f < 0.2 \text{ Hz}; \\ 0, & \Delta f \geq 0.2 \text{ Hz} \end{cases}.$$

In an embodiment, the phase angle difference evaluation coefficient $\eta_\varphi$ is obtained according to data of the phase angle difference $\Delta \varphi$:

$$\eta_\varphi = \begin{cases} 1, & \Delta \varphi < 5\%, \\ 0, & \Delta \varphi \geq 5\% \end{cases}.$$

In an embodiment, the simulated synchronization closing quality coefficient $\eta$ may be calculated according to a sum of the voltage difference evaluation coefficient $\eta_U$, the frequency difference evaluation coefficient $\eta_f$, and the phase angle difference evaluation coefficient $\eta_\varphi$:

$$\eta = \eta_U + \eta_f + \eta_\varphi.$$

In an embodiment, that the synchronization closing performance of the outlet switch apparatus of the target generator set is evaluated according to the simulated synchronization closing quality coefficient may include: whether the simulated synchronization closing quality coefficient satisfies a preset coefficient relationship is determined; and when the simulated synchronization closing quality coefficient satisfies the preset coefficient relationship, the synchronization closing performance of the outlet switch apparatus of the target generator set is determined to be qualified.

The preset coefficient relationship may be whether the simulated synchronization closing quality coefficient is greater than or equal to a set numerical value, and in this embodiment, the set numerical value may be 3, 4, 5 and the like.

In this embodiment, after the simulated synchronization closing quality coefficient is calculated out, it may be determined whether the simulated synchronization closing quality coefficient is greater than or equal to the set numerical value. When the simulated synchronization closing quality coefficient is greater than or equal to the set numerical value, the synchronization closing performance of the outlet switch apparatus of the target generator set is determined to be qualified.

In the embodiments of the present application, prior to the synchronization grid-connected of the outlet switch apparatus of the target generator set, whether the wiring phase sequence of a synchronization apparatus is correct is determined; in a case where the wiring phase sequence of the synchronization apparatus is determined to be correct, whether the three-phase closings of the outlet switch apparatus are synchronous is determined; in a case where the three-phase closings of the outlet switch apparatus are determined to be satisfied the synchronism, the two-side voltage waveform data at the closing moment of the outlet switch apparatus is measured and recorded; and the simulated synchronization closing quality coefficient of the outlet switch apparatus of the target generator set is determined according to the two-side voltage waveform data, and the synchronization closing performance of the outlet switch apparatus of the target generator set is evaluated according to the simulated synchronization closing quality coefficient, in this way, the synchronization closing performance is verified prior to the synchronization grid-connection of the generator set, thereby effectively avoiding the problem of burn-out of the generator and the outlet switch apparatus caused by a non-synchronization closing.

In order to better understand the method for the synchronization test of the generator set outlet switch apparatus provided in the embodiments of the present application, the method is described below by using one specific example, and it mainly includes the following:

(1) the correctness of the wiring phase sequence of the synchronization apparatus is inspected by using the alternating current power generator and referring to the typical wiring diagram of the synchronization apparatus;

(2) the synchronization apparatus is controlled to send the synchronization closing instruction to the generator outlet switch apparatus, to verify the synchronism of the three-phase closing of the generator outlet switch apparatus;

(3) a commutation knife gate is simulated to be at the closing position, the generator set is started in the power generation direction, the synchronization apparatus automatically sends the synchronization closing instruction, and the two-side voltage waveform data at the closing moment of the generator outlet switch apparatus are measured and recorded; and (4) a simulated synchronization closing quality coefficient $\eta$ of a pumped storage set is calculated, and the correctness of the synchronization closing function is determined according to the simulated synchronization closing quality coefficient.

In a specific implementation, a capacity of a #1 machine of a newly-built pumped storage power station is 300 MW, the generator stator outlet switch apparatus, the arrangement of the isolation knife gate, and the wiring diagram of the synchronization apparatus are shown in FIG. 2.

Firstly, according to the above-described step (1), with reference to the typical wiring diagram of the synchronization apparatus, three-phase different voltages $U_n$ (n=a, b, c), i.e., $U_a$=10V; $U_b$=20V; $U_c$=30V, are applied at the secondary terminal of the generator outlet voltage transformer by using the low-voltage alternating current power generator, three-phase different voltages $U_m$ (m=A, B, C), i.e., $U_A$=15V; $U_B$=25V; $U_C$=35V are applied at the secondary terminal of the main transformer low-voltage side voltage transformer by using the low-voltage alternating current power generator, and further the A-phase voltage $U'_a$ and $U'_A$, i.e., $U'_a$=10.2V; $U'_A$=15.1V, displayed by the synchronization apparatus may be checked. By calculation, the following results are obtained:

$$|U'_a - U_a| = |10.2 - 10|V = 0.2V < 0.5V$$

$$|U'_A - U_A| = |15.1 - 15|V = 0.1V < 0.5V$$

It is determined that $(|U'_a - U_a| < 0.5V)$ & $(|U'_A - U_A| < 0.5V)$ is true, then the step (2) is performed.

Then, according to the above-described step (2), the synchronization apparatus is controlled to send the synchronization closing instruction to the generator outlet switch apparatus, the synchronism of the three-phase closings of the generator outlet switch apparatus is inspected. At the synchronization apparatus, the synchronization apparatus is manually controlled to send the synchronization closing instruction to the generator outlet switch apparatus, the time, i.e., $t_A$, $t_B$, $t_C$ of three phases of the generator outlet switch apparatus at the closing position is inquired on the computer monitoring system, where $t_A$=14:26:08:245, $t_B$=14:26:08:245, and $t_C$=14:26:08:247, and the three-phase synchronism time $t_h$ is calculated:

$$t_h = \text{Max}\{|t_A - t_B|, |t_A - t_C|, |t_B - t_C|\} = 2 \text{ ms}$$

It is determined that $t_h < 5$ ms is true, then the step (3) is performed.

Figure 3:
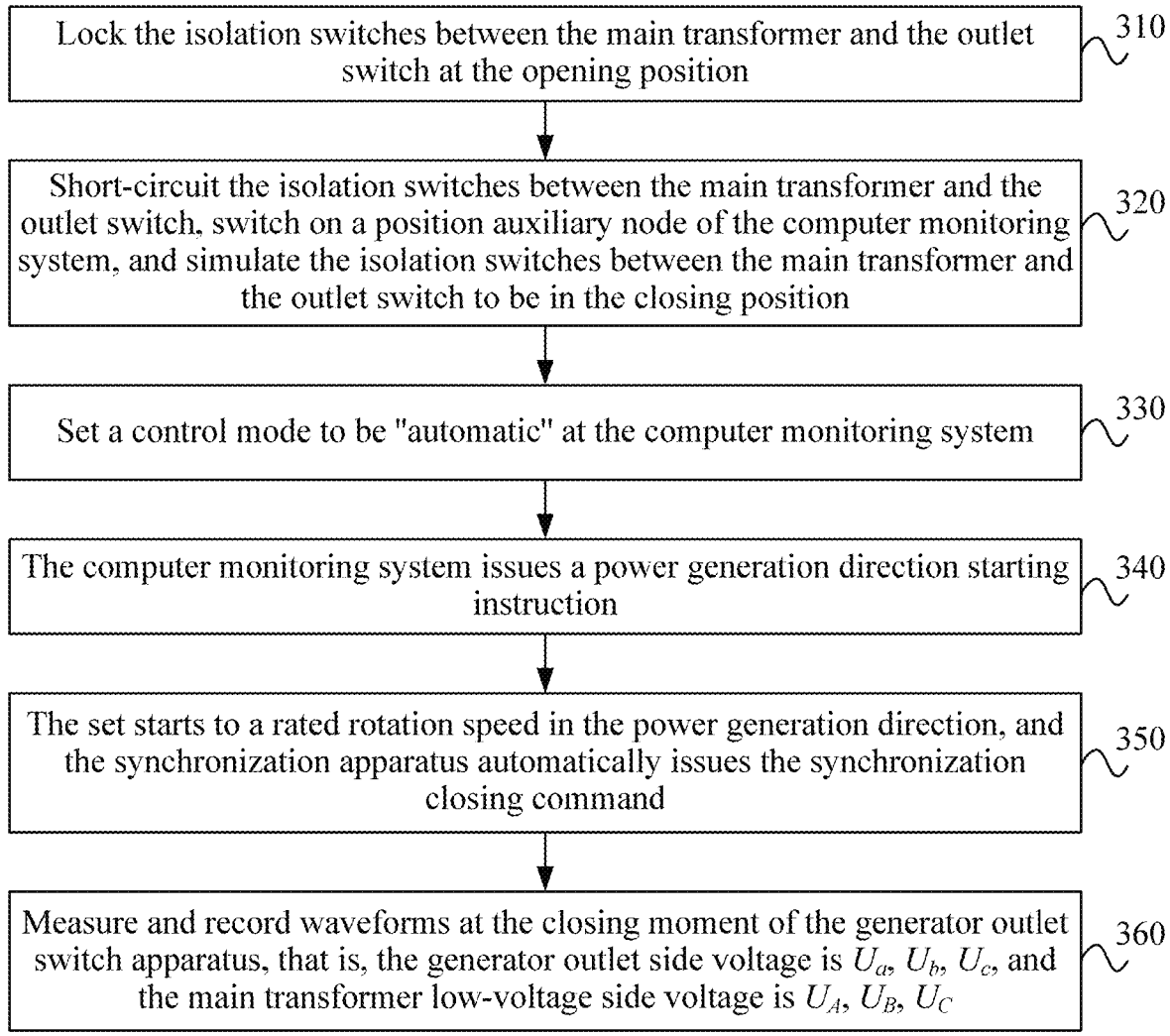
FIG. 3 is a flowchart of measuring and recording two-side voltage waveform data of an outlet switch apparatus at a closing moment according to an embodiment of the present application.

In an embodiment, according to the above-described step (3), the commutation knife gate is simulated to be at the closing position, the generator set is started in the power generation direction, the synchronization apparatus automatically sends the synchronization closing instruction, and the two-side voltage waveform data at the closing moment of the generator outlet switch apparatus are measured and recorded. The flowchart of the synchronization test is simulated according to FIG. 3. FIG. 3 is a flowchart of measuring and recording two-side voltage waveform data of an outlet switch apparatus at a closing moment according to an embodiment of the present application. Referring to FIG. 3, it mainly includes the following steps.

In step 310, the isolation switches between the main transformer and the outlet switch are locked at the opening position.

In step 320, the isolation switches between the main transformer and the outlet switch are short-circuited and connected to a position auxiliary node of the computer monitoring system, and the isolation switches between the main transformer and the outlet switch are simulated to be in the closing position.

In step 330, a control mode is set to be "automatic" at the computer monitoring system.

In step S340, the computer monitoring system issues a power generation direction starting instruction.

In step 350, the generator set starts to a rated rotation speed in the power generation direction, and the synchronization apparatus automatically sends the synchronization closing instruction.

In step 360, waveforms at the closing moment of the generator outlet switch apparatus are measured and recorded, that is the generator outlet side voltage is $U_a$, $U_b$, $U_c$, and the main transformer low-voltage side voltage is $U_A$, $U_B$, $U_C$.

The waveform data diagrams of the generator outlet side voltage $U_a$, $U_b$, $U_c$ and the main transformer low-voltage side voltage $U_A$, $U_B$, $U_C$ are obtained by measuring and recording.

Finally, according to the above-described step (4), the simulated synchronization closing quality coefficient η of the pumped storage set is calculated, and the correctness of the synchronization closing function is determined according to the simulated synchronization closing quality coefficient.

In this example, the amplitude values ($U_a$, $U_b$, $U_c$), specifically, $U_a$=59.28V; $U_b$=59.10V; $U_c$=59.21V, the frequencies ($f_a$, $f_b$, $f_c$), specifically, $f_a$=50.116 Hz; $f_b$=50.127 Hz; $f_c$=50.121 Hz and the phase angles ($\varphi_a$, $\varphi_b$, $\varphi_c$), specifically, $\varphi_a$=12.46°; $\varphi_b$=132.57°; $\varphi_c$=−107.25° of the generator outlet side voltages, as well as the amplitude values ($U_A$, $U_B$, $U_C$), specifically, $U_A$=60.17V; $U_B$=60.25V; $U_B$=60.04V, the frequencies ($f_A$, $f_B$, $f_C$), specifically, $f_A$=50.121 Hz; $f_B$=50.133 Hz; $f_C$=50.114 Hz and the phase angles ($\varphi_A$, $\varphi_B$, $\varphi_C$), specifically, $\varphi_A$=13.77°; $\varphi_B$=134.15°; $\varphi_C$=−106.21° of the main transformer low-voltage side voltages at the closing moment of the generator outlet switch apparatus is extracted according to the waveform data of the generator outlet side voltage $U_a$, $U_b$, $U_c$ and the main transformer low-voltage side voltage $U_A$, $U_B$, $U_C$ measured and recorded in the step (3).

The voltage amplitude difference ΔU, the frequency difference Δf and the phase angle difference Δφ are sequentially calculated:

$$\Delta U = \left\{\left|\frac{U_a - U_A}{U_A}\right|, \left|\frac{U_b - U_B}{U_B}\right|, \left|\frac{U_c - U_C}{U_C}\right|\right\} = 1.91\%;$$

$$\Delta f = \{|f_a - f_A|, |f_b - f_B|, |f_c - f_C|\} = 0.007 \text{ Hz; and}$$

$$\Delta\varphi = \{|\varphi_a - \varphi_A|, |\varphi_b - \varphi_B|, |\varphi_c - \varphi_C|\} = 1.58°;$$

A voltage difference evaluation coefficient $\eta_U$ is obtained according to the voltage amplitude difference ΔU data:

$$\eta_U = \begin{cases} 1, & \Delta U < 5\%, \\ 0, & \Delta U \geq 5\% \end{cases}.$$

Since ΔU=1.91%<5%, $\eta_U$=1 is obtained.

A frequency difference evaluation coefficient $\eta_f$ is obtained according to the frequency difference Δf data:

$$\eta_f = \begin{cases} 1, & \Delta f < 0.2 \text{ Hz}; \\ 0, & \Delta f \geq 0.2 \text{ Hz} \end{cases}.$$

Since Δf=0.007 Hz<0.2 Hz, $\eta_f$=1 is obtained.

A phase angle difference evaluation coefficient $\eta_\varphi$ is obtained according to the phase angle difference Δφ data:

$$\eta_\varphi = \begin{cases} 1, & \Delta\varphi < 5\%, \\ 0, & \Delta\varphi \geq 5\% \end{cases}.$$

Since Δφ=1.58°<5°, $\eta_\varphi$=1 is obtained.

The simulated synchronization closing quality coefficient η is calculated according to the voltage difference evaluation coefficient $\eta_U$, the frequency difference evaluation coefficient $\eta_f$ and the phase angle difference evaluation coefficient $\eta_\varphi$:

$$\eta = \eta_U + \eta_f + \eta_\varphi = 1+1+1 = 3 \geq 3.$$

It is determined that the simulated synchronization closing quality coefficient η≥3 is true, and the success of a simulated synchronization closing test is verified.

By means of the above-described test method, the quality of the synchronization test simulated by the outlet switch apparatus is effectively obtained, before the synchronization grid-connection of the set, the performance of the synchronization closing of the outlet switch apparatus is verified in advance, so that the problem of burn-out of the generator and the outlet switch apparatus caused by non-synchronization closing is effectively avoided, and the safety of the whole set of tests of the generator set is improved.

At the present stage, the synchronization grid-connection of the outlet switch apparatus of the newly-built generator set has the following problems.

(1) The manufacturing process of the operation mechanism of the generator outlet switch apparatus is poor, therefore, the three-phase closings, i.e., A, B, and C are not synchronous, three-phase unbalanced currents appear when the set is performed the synchronization grid-connection in the power generation direction, so that the generator relay protection is tripped due to the fault.

(2) The error of the phase sequence wiring of the synchronous apparatus causes the non-synchronization closing of the generator outlet switch apparatus, and causes the overcurrent of the outlet switch apparatus and the generator, so that the electrical service life is greatly shortened.

(3) The parameters of the synchronous apparatus are improperly set, so that deviations of the voltage amplitudes and the phase angles at two sides of the generator outlet switch apparatus are relatively large, and the synchronization closing quality of the outlet switch apparatus is poor.

In the solutions of the embodiments of the present application, the method for simulating the application of voltage by adopting the low-voltage power generator is used for checking the correctness of the wiring of the synchronous apparatus. Compared with the traditional phase checking method using wires, the method provided in the present application is more visual and reliable, so that the non-synchronization closing is effectively avoided. Moreover, the synchronism of three-phase actions of the generator outlet switch apparatus is calculated according to the data of the computer monitoring system, so that the occurrence of unbalance of three-phase is avoided; the quality of the synchronization closing is determined by utilizing the quantifiable simulated synchronization closing quality coefficient r, so that the voltage difference, the frequency difference and the phase angle difference of the synchronization closing are effectively controlled, and the correctness of the closing of the generator outlet switch apparatus is inspected.

Figure 4:
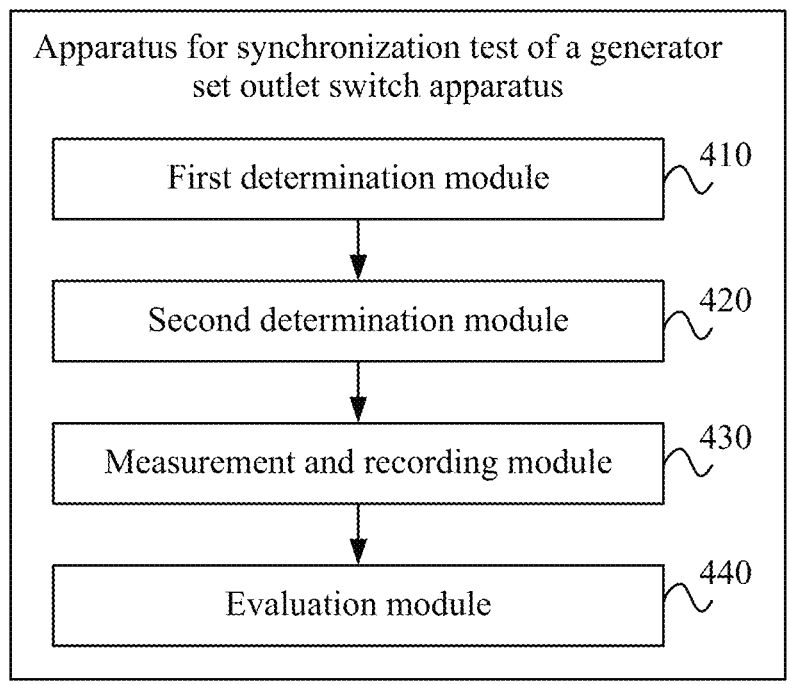
FIG. 4 is a schematic structural diagram of an apparatus for synchronization test of a generator set outlet switch apparatus according to an embodiment of the present application.

FIG. 4 is a schematic structural diagram of an apparatus for synchronization test of a generator set outlet switch apparatus according to an embodiment of the present application. The apparatus may perform the method for the synchronization test of the generator set outlet switch apparatus provided in any one of the embodiments described above. As shown in FIG. 4, the apparatus includes a first determination module 410, a second determination module 420, a measurement and recording module 430 and an evaluation module 440.

The first determination module 410 is configured to determine whether a wiring phase sequence of a synchronization apparatus is correct prior to a synchronization grid-connected closing of an outlet switch apparatus of a target generator set.

The second determination module 420 is configured to determine whether three-phase closings of the outlet switch apparatus are synchronous in a case where the wiring phase sequence of the synchronization apparatus is determined to be correct.

The measurement and recording module 430 is configured to measure and record two-side voltage waveform data at a closing moment of the outlet switch apparatus in a case where the three-phase closings of the outlet switch apparatus are determined to be satisfied synchronism.

The evaluation module 440 is configured to determine a simulated synchronization closing quality coefficient of the outlet switch apparatus of the target generator set according to the two-side voltage waveform data, and evaluate a synchronization closing performance of the outlet switch apparatus of the target generator set according to the simulated synchronization closing quality coefficient.

According to the solution of this embodiment, the first determination module is configured to determine whether the wiring phase sequence of the synchronization apparatus is correct prior to the synchronization grid-connected closing of the outlet switch apparatus of the target generator set, the second determination module is configured to determine whether the three-phase closings of the outlet switch apparatus are synchronous in a case where the wiring phase sequence of the synchronization apparatus is determined to be correct, the measurement and recording module is configured to measure and record the two-side voltage waveform data at the closing moment of the outlet switch apparatus in a case where the three-phase closings of the outlet switch apparatus are determined to be satisfied synchronism, and the evaluation module is configured to determine the simulated synchronization closing quality coefficient of the outlet switch apparatus of the target generator set according to the two-side voltage waveform data, and evaluate the synchronization closing performance of the outlet switch apparatus of the target generator set according to the simulated synchronization closing quality coefficient, in this way, the synchronization closing performance is verified prior to the synchronization grid-connection of the generator set, thereby effectively avoiding the problem of burn-out of the generator and the outlet switch apparatus caused by a non-synchronization closing.

In one optional embodiment of this embodiment, the first determination module 410 is configured to: apply, through an alternating current power generator, at least three-phase different target voltages at a secondary terminal of a generator outlet voltage transformer, and apply, through the alternating current power generator, at least three-phase different reference voltages at a secondary terminal of a main transformer low-voltage side voltage transformer; and determine that the wiring phase sequence of the synchronization apparatus is correct when an A-phase voltage in the target voltages and an A-phase voltage in the reference voltages satisfy a preset relationship.

In one optional embodiment of this embodiment, the first determination module 410 is further configured to: in a case where the wiring phase sequence of the synchronization apparatus is determined to be incorrect, investigate a voltage sampling wiring circuit of the synchronization apparatus, and continue to apply, through the alternating current power generator, the at least three-phase different target voltages at the secondary terminal of the generator outlet voltage transformer, and apply, through the alternating current power generator, the at least three-phase different reference voltages at the secondary terminal of the main transformer low-voltage side voltage transformer, until the A-phase voltage in the target voltages and the A-phase voltage in the reference voltages are determined to satisfy the preset relationship.

In one optional embodiment of this embodiment, the second determination module 420 is configured to: send, through the synchronization apparatus, a synchronization closing instruction to the outlet switch apparatus, query time of three-phase of the outlet switch apparatus at a closing position, and calculate, according to the time, to obtain three-phase synchronization time; and determine that the three-phase closings of the outlet switch apparatus satisfy synchronism when the three-phase synchronization time is less than a set time threshold value.

In one optional embodiment of this embodiment, the measurement and recording module 430 is configured to measure and record generator outlet side voltages and main transformer low-voltage side voltages at the closing moment of the outlet switch apparatus.

In one optional embodiment of this embodiment, the evaluation module 440 is configured to: respectively determine, according to the generator outlet side voltages and the main transformer low-voltage side voltages, amplitudes, frequencies and phase angles of the generator outlet side voltages and amplitudes, frequencies and phase angles of the main transformer low-voltage side voltages, and determine a voltage amplitude difference, a frequency difference and a phase angle difference; determine a voltage difference evaluation coefficient according to the voltage amplitude difference; determine a frequency difference evaluation coefficient according to the frequency difference; determine a phase angle difference evaluation coefficient according to the phase angle difference, and determine the simulated synchronization closing quality coefficient according to the voltage difference evaluation coefficient, the frequency difference evaluation coefficient, and the phase angle difference evaluation coefficient.

In one optional embodiment of this embodiment, the evaluation module 440 is further configured to: determine whether the simulated synchronization closing quality coefficient satisfies a preset coefficient relationship; and when the simulated synchronization closing quality coefficient satisfies the preset coefficient relationship, determine that the synchronization closing performance of the target generator set is qualified.

The apparatus for synchronization test of the generator set outlet switch apparatus provided in the embodiments of the present application may perform the method for synchronization test of the generator set outlet switch apparatus provided in any of the embodiments of the present application, and this apparatus has corresponding functional modules and beneficial effects for executing the method.

Figure 5:
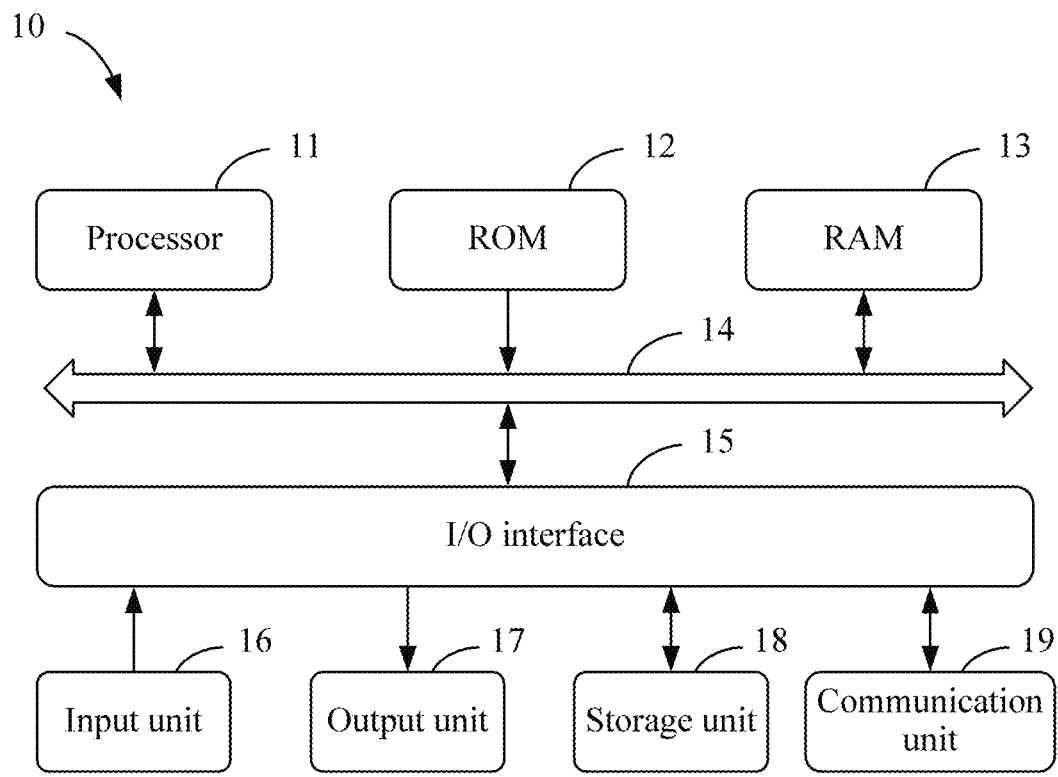
FIG. 5 is a schematic structural diagram of an electronic device implementing a method for synchronization test of a generator set outlet switch apparatus according to an embodiment of the present application.

FIG. 5 shows a schematic structural diagram of an electronic device 10 that may be used for implementing the embodiments of the present application. The electronic device is intended to represent various forms of digital computers, such as a laptop, a desktop, a workstation, a personal digital assistant, a server, a blade server, a mainframe computer, and other appropriate computers. The electronic device may also represent various forms of mobile apparatuses, such as personal digital processing, a cellphone, a smartphone, a wearable device (such as, a helmet, a glass, a watch,), and other similar computing apparatuses. The components shown herein, their connections and relationships between these components, and the functions of these components, are illustrative only.

As shown in FIG. 5, the electronic device 10 includes at least one processor 11 and a memory communicatively connected to the at least one processor 11, such as a read-only memory (ROM) 12 and a random access memory (RAM) 13, where the memory stores a computer program executable by at least one processor. The processor 11 may perform various appropriate actions and processes according to a computer program stored in a read-only memory (ROM) 12 or a computer program loaded from a storage unit 18 into a random-access memory (RAM) 13. Various programs and data required for the operation of the electronic device 10 may also be stored in the RAM 13. The processor 11, the ROM 12 and the RAM 13 are connected to each other via the bus 14. An input/output (U/O) interface 15 is also connected to the bus 14.

Multiple components in the electronic device 10 are connected to the I/O interface 15, and the multiple components include an input unit 16 such as a keyboard or a mouse, an output unit 17 such as various types of displays or speakers, a storage unit 18 such as a magnetic disk or an optical disk, and a communication unit 19 such as a network card, a modem or a wireless communication transceiver. The communication unit 19 allows the electronic device 10 to exchange information/data with other devices through a computer network such as the Internet and/or various telecommunication networks.

The processor 11 may be a variety of general-purpose and/or special-purpose processing assemblies having processing and computing capabilities. Some examples of the processor 11 include a central processing unit (CPU), a graphics processing unit (GPU), various special-purpose artificial intelligence (AI) computing chips, various processors executing machine learning model algorithms, a digital signal processor (DSP), and any suitable processor, controller and microcontroller. The processor 11 performs the various methods and processes described above, such as the method for synchronization test of the generator set outlet switch apparatus.

In some embodiments, the method for synchronization test of the generator set outlet switch apparatus may be implemented as computer programs tangibly embodied on a computer-readable storage medium, such as the storage unit 18. In some embodiments, part or all of the computer programs may be loaded into and/or installed on the electronic device 10 via the ROM 12 and/or the communication unit 19. When the computer program is loaded into the RAM 13 and executed by the processor 11, one or more steps of the method for synchronization test of the generator set outlet switch apparatus described above may be performed. Alternatively, in other embodiments, the processor 11 may be configured in any other suitable manner (such as, by means of firmware) to perform the method for synchronization test of the generator set outlet switch apparatus.

Various embodiments of the system and the technique described above herein may be achieved in a digital electronic circuit system, an integrated circuit system, a field programmable gate array (FPGA), an application specific integrated circuit (ASIC), an application specific standard part (ASSP), a system on chip (SOC), a complex programmable logic device (CPLD), a computer hardware, a firmware, a software, and/or combinations thereof. These various embodiments may include an embodiment in one or more computer programs, and the one or more computer programs are executable and/or interpretable on a programmable system including at least one programmable processor, the programmable processor may be a special-purpose or general-purpose programmable processor for receiving data and instructions from a storage system, at least one input apparatus and at least one output apparatus and transmitting the data and instructions to the storage system, the at least one input apparatus and the at least one output apparatus.

Computer programs for implementing the method of the embodiments of the present application may be written in any combination of one or more programming languages. These program codes may be provided to the processor of a general-purpose computer, a special-purpose computer, or other programmable data processing apparatus to enable the functions/operations specified in the flowchart and/or the block diagram to be implemented when the computer programs are executed by the processor The computer programs may be executed entirely on a machine, partly on the machine, as a stand-alone software package, partly on the machine and partly on a remote machine, or entirely on the remote machine or server.

In the context of the embodiments of the present application, the computer-readable storage medium may be a tangible medium that may contain or store a computer program available for an instruction execution system, apparatus or device or a computer program used in conjunction with an instruction execution system, apparatus or device. The computer-readable storage medium may include an electronic, magnetic, optical, electromagnetic, infrared, or semiconductor system, apparatus, or device, or any suitable combination of the foregoing. Alternatively, the computer-readable storage medium may be a machine-readable signal medium. The machine-readable signal medium may include an electrical connection based on one or more wires, a portable computer diskette, a hard disk, a random access memory (RAM), a read-only memory (ROM), an erasable programmable read-only memory (EPROM or a flash memory), an optical fiber, a portable compact disc read-only memory (CD-ROM), an optical storage device, a magnetic storage device, or any appropriate combination of the foregoing.

To provide the interaction with the user, the system and technology described here may be implemented on the electronic device. The electronic device has a display apparatus (such as, a cathode-ray tube (CRT) or liquid crystal display (LCD) monitor) for displaying information to the user; and a keyboard and a pointing apparatus (such as, a mouse or a trackball) through which the user may provide input to the electronic device. Other kinds of apparatuses may also be used for providing for interaction with the user; for example, the feedback provided to the user may be sensory feedback in any form (such as, visual feedback, auditory feedback, or tactile feedback); and input from the user may be received in any form (including acoustic input, speech input, or tactile input).

The system and technology described here may be implemented in a computing system including a back-end component (such as, a data server), or a computing system including a middleware component (such as, an application server), or a computing system including a front-end component (such as, a client computer having a graphical user interface or a web browser through which the user may interact with the embodiments of the system and technology described herein), or a computing system including any combination of such back-end component, such middleware component, or such front-end component. The components of the system may be interconnected by any form or medium of digital data communication (such as, a communication network). Examples of the communication network include a local area network (LAN), a wide area network (WAN), a blockchain network and the Internet.

The computing system may include a client and a server. The client and the server are generally remote from each other and typically interact through the communication network. A relationship between the client and the server arises by virtue of computer programs running on respective computers and having a client-server relationship to each other. The server may be a cloud server, also referred to as a cloud computing server or a cloud host. As a host product in a cloud computing service system, the server solves the defects of difficult management and weak service scalability in a traditional physical host and a virtual private server (VPS) service.

What is claimed is:

1. A method for synchronization test of a generator set outlet switch apparatus, comprising:
   prior to a synchronization grid-connected closing of an outlet switch apparatus of a target generator set, determining whether a wiring phase sequence of a synchronization apparatus is correct;
   in a case where the wiring phase sequence of the synchronization apparatus is determined to be correct, determining whether three-phase closings of the outlet switch apparatus are synchronous;
   in a case where the three-phase closings of the outlet switch apparatus are determined to be satisfied synchronism, measuring and recording two-side voltage waveform data at a closing moment of the outlet switch apparatus; and
   determining a simulated synchronization closing quality coefficient of the outlet switch apparatus of the target generator set according to the two-side voltage waveform data, and evaluating a synchronization closing performance of the outlet switch apparatus of the target generator set according to the simulated synchronization closing quality coefficient.

2. The method of claim 1, wherein determining whether the wiring phase sequence of the synchronization apparatus is correct comprises:
   applying, through an alternating current power generator, at least three-phase different target voltages at a secondary terminal of a generator outlet voltage transformer, and applying, through the alternating current power generator, at least three-phase different reference voltages at a secondary terminal of a main transformer low-voltage side voltage transformer; and
   when an A-phase voltage in the target voltages and an A-phase voltage in the reference voltages satisfy a preset relationship, determining that the wiring phase sequence of the synchronization apparatus is correct.

3. The method of claim 2, wherein after determining whether the wiring phase sequence of the synchronization apparatus is correct, the method further comprises:
   in a case where the wiring phase sequence of the synchronization apparatus is determined to be incorrect, investigating a voltage sampling wiring circuit of the synchronization apparatus, and continuing to apply, through the alternating current power generator, the at least three-phase different target voltages at the secondary terminal of the generator outlet voltage transformer, and apply, through the alternating current power generator, the at least three-phase different reference voltages at the secondary terminal of the main transformer low-voltage side voltage transformer, until the A-phase voltage in the target voltages and the A-phase voltage in the reference voltages are determined to satisfy the preset relationship.

4. The method of claim 1, wherein determining whether the three-phase closings of the outlet switch apparatus are synchronous comprises:
   sending, through the synchronization device, a synchronization closing instruction to the outlet switch apparatus, querying time of three-phase of the outlet switch apparatus at a closing position, and calculating, according to the time, to obtain three-phase synchronization time; and
   when the three-phase synchronization time is less than a set time threshold value, determining that the three-phase closings of the outlet switch apparatus satisfy synchronism.

5. The method of claim 1, wherein measuring and recording the two-side voltage waveform data at the closing moment of the outlet switch apparatus comprises:
   measuring and recording generator outlet side voltages and main transformer low-voltage side voltages at the closing moment of the outlet switch apparatus.

6. The method of claim 5, wherein determining the simulated synchronization closing quality coefficient of the outlet switch apparatus of the target generator set according to the two-side voltage waveform data comprises:
   respectively determining, according to the generator outlet side voltages and the main transformer low-voltage side voltages, amplitudes, frequencies and phase angles of the generator outlet side voltages and amplitudes, frequencies and phase angles of the main transformer low-voltage side voltages, and determining a voltage amplitude difference, a frequency difference and a phase angle difference;
   determining a voltage difference evaluation coefficient according to the voltage amplitude difference;
   determining a frequency difference evaluation coefficient according to the frequency difference;
   determining a phase angle difference evaluation coefficient according to the phase angle difference; and
   determining the simulated synchronization closing quality coefficient according to the voltage difference evaluation coefficient, the frequency difference evaluation coefficient, and the phase angle difference evaluation coefficient.

7. The method of claim 6, wherein evaluating the synchronization closing performance of the outlet switch apparatus of the target generator set according to the simulated synchronization closing quality coefficient comprises:
   determining whether the simulated synchronization closing quality coefficient satisfies a preset coefficient relationship; and
   when the simulated synchronization closing quality coefficient satisfies the preset coefficient relationship, determining that the synchronization closing performance of the target generator set is qualified.

8. An electronic device, comprising:
   at least one processor; and
   a memory communicatively connected to the at least one processor;
   wherein the memory stores a computer program executable by the at least one processor, and the computer program, when executed by the at least one processor, causes the at least one processor to perform the method for synchronization test of a generator set outlet switch apparatus of claim 1.

9. A non-transitory computer-readable storage medium storing a computer instruction, wherein the computer instruction is configured to implement, when executed by a processor, the method for synchronization test of a generator set outlet switch apparatus of claim 1.

\* \* \* \* \*